United States Patent
Tarkiainen

(10) Patent No.: US 7,280,938 B2
(45) Date of Patent: Oct. 9, 2007

(54) METHOD FOR DETERMINING A NEGATIVE SEQUENCE COMPONENT

(75) Inventor: Antti Tarkiainen, Lappeenranta (FI)

(73) Assignee: ABB Oy, Helsinki (FI)

( * ) Notice: Subject to any disclaimer, the term of this patent is extended or adjusted under 35 U.S.C. 154(b) by 315 days.

(21) Appl. No.: 10/512,054

(22) PCT Filed: Mar. 11, 2004

(86) PCT No.: PCT/FI2004/000139

§ 371 (c)(1),
(2), (4) Date: Oct. 21, 2004

(87) PCT Pub. No.: WO2004/081591

PCT Pub. Date: Sep. 23, 2004

(65) Prior Publication Data

US 2005/0162170 A1    Jul. 28, 2005

(30) Foreign Application Priority Data

Mar. 14, 2003    (FI) .................................. 20030386

(51) Int. Cl.
*H02M 5/00*    (2006.01)
*G01R 19/00*    (2006.01)

(52) U.S. Cl. .................. 702/158; 363/48; 363/164; 702/57; 702/64

(58) Field of Classification Search .............. 702/57, 702/64, 67, 158; 363/48, 164; 361/76, 78; 324/107, 347; 700/294; 333/28 R
See application file for complete search history.

(56) References Cited

U.S. PATENT DOCUMENTS

| 4,210,948 A | 7/1980 | Waltz ....................... 361/76 |
| 5,426,590 A | 6/1995 | Martin ..................... 700/294 |
| 6,201,715 B1 * | 3/2001 | Huggett et al. ............... 363/48 |

FOREIGN PATENT DOCUMENTS

EP    0 599 648    6/1994    ................. 324/107

\* cited by examiner

*Primary Examiner*—Bryan Bui
*Assistant Examiner*—John Le
(74) *Attorney, Agent, or Firm*—Dykema Gossett PLLC

(57) ABSTRACT

The invention relates to a method for determining properties of a negative sequence component of a space vector quantity in an electrical network. The method according to the invention includes the steps of determining on the basis of the properties of an ellipse formed by a space vector of the space vector quantity in the electrical network the magnitude of the negative sequence component of the space vector quantity in the electrical network and the location of the negative sequence component of the space vector quantity in the electrical network in relation to a positive sequence component.

9 Claims, 1 Drawing Sheet

METHOD FOR DETERMINING A NEGATIVE SEQUENCE COMPONENT

BACKGROUND OF THE INVENTION

The invention relates to determining properties of a negative sequence component of a space vector quantity in an electrical network.

A three-phase unbalanced network can be presented with the aid of three symmetrical three-phase components, i.e. the zero sequence system (ZSS), the positive sequence system (PSS) and the negative sequence system (NSS).

The negative sequence system is defined by means of negative sequence components of quantities in an electrical network. Negative sequence components of quantities can be utilized in monitoring and controlling the electrical network.

BRIEF DESCRIPTION OF THE INVENTION

An object of the invention is to provide a method for determining properties of a negative sequence component of a space vector quantity in an electrical network. This object is achieved with a method that is characterized by what is stated in the independent claim. Preferred embodiments of the invention are described in the dependent claims.

The method according to the invention for determining properties of a negative sequence component of a space vector quantity in an electrical network can be utilized with compensation methods of voltage unbalance in an electrical network, for example.

The invention is based on determining the properties of the negative sequence component of a space vector quantity in an electrical network on the basis of the properties of an ellipse formed by a space vector of the space vector quantity in the electrical network.

BRIEF DESCRIPTION OF THE FIGURES

The invention will now be described in greater detail in connection with preferred embodiments, with reference to the attached drawings, of which.

DETAILED DESCRIPTION OF THE INVENTION

The space vector quantity of an electrical network the properties of whose negative sequence component can be determined by means of the method according to the invention may be, for example, voltage or current. Below, there is an example where the properties of the negative sequence component are determined for the voltage of an electrical network.

Figure 1:
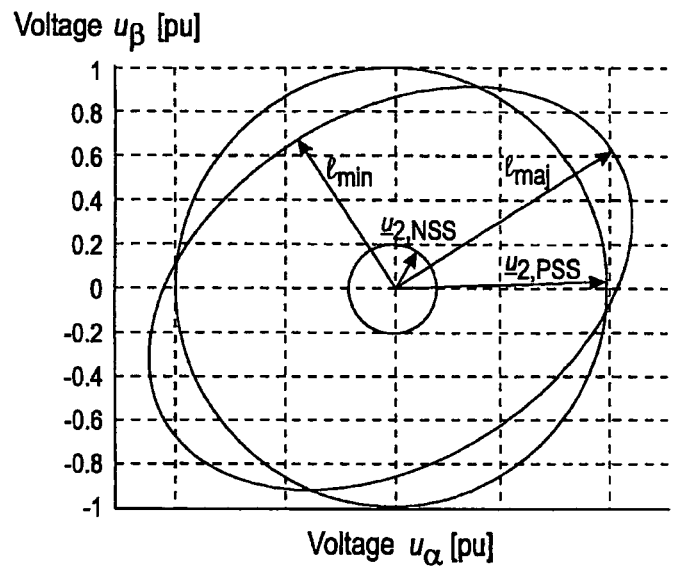
FIG. 1 shows circular graphs drawn by the tips of space vectors of the positive sequence and negative sequence systems, and an elliptical graphs drawn by the tip of a sum vector.

If no zero sequence component occurs in the electrical network, the total voltage is the sum of the negative sequence and the positive sequence components, in which case the graph of the voltage vector $\underline{u}_2$ in the network is an ellipse in accordance with FIG. 1, and the voltage vector in question can be determined with the following equation:

$$\underline{u}_2 = u_{2,PSS} e^{j\omega t} + u_{2,NSS} e^{-j(\omega t - \phi)},$$

where $u_{2,PSS}$ is the magnitude of the positive sequence component of the voltage in the electrical network, $u_{2,NSS}$ is the magnitude of the negative sequence component of the voltage in the electrical network, $\omega$ is the angular frequency, $t$ is time, and $\phi$ is the phase-angle difference between the positive sequence and negative sequence systems at starting time. At the major semi-axis of the ellipse the angles of the positive and negative sequence system vectors are the same, so that the angle of the major semi-axis is $$\alpha_{maj} = \phi/2 + n\pi.$$

The length $l_{maj}$ of the major semi-axis of the ellipse is the sum of the length $u_{2,PSS}$ of the positive sequence vector and the length $u_{2,NSS}$ of the negative sequence vector of the voltage. The minor semi-axis of the ellipse is perpendicular relative to the major semi-axis, so that its angle is $$\alpha_{min} = \phi/2 - \pi/2 + n\pi.$$

The length $l_{min}$ of the minor semi-axis is the difference between the length $u_{2,PSS}$ of the positive sequence vector and the length $u_{2,NSS}$ of the negative sequence vector of the voltage. The length $u_{2,PSS}$ of the positive sequence vector of the voltage is received by dividing the sum of the length $l_{maj}$ of the major semi-axis and the length $l_{min}$ of the minor semi-axis by two.

$$u_{2,PSS} = \frac{l_{maj} + l_{min}}{2}$$

Correspondingly, the length $u_{2,NSS}$ of the negative sequence vector of the voltage is received by dividing the difference between the length $l_{maj}$ of the major semi-axis and the length $l_{min}$ of the minor semi-axis by two.

$$u_{2,NSS} = \frac{l_{maj} - l_{min}}{2}$$

On the basis of the above, the magnitudes of the positive sequence and negative sequence system components can be deduced from the lengths of the semi-axes of the ellipse. As noted above, the phase-angle difference between the positive sequence and negative sequence systems at starting time can be deduced from the angle of the major semi-axis of the ellipse. Thus, determining the negative sequence network can be returned to determining the properties of the sum voltage ellipse.

Figure 2:
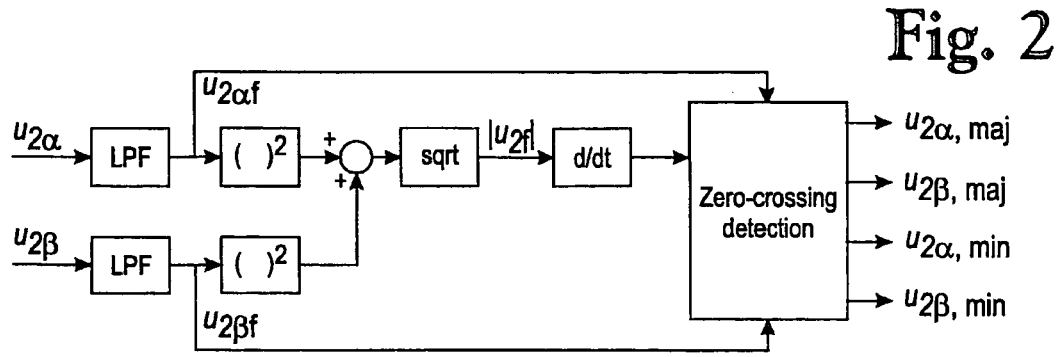
FIG. 2 shows a block diagram for determining the components of the semi-axes of an ellipse formed by a voltage space vector in an electrical network.

FIG. 2 shows one way to determine components $u_{2\alpha,maj}$, $u_{2\beta,maj}$, $u_{2\alpha,min}$ and $u_{2\beta,min}$ of the major and minor semi-axes of the ellipse formed by the voltage space vector in the electrical network. The voltage vector components $u_{2\alpha}$ and $u_{2\beta}$ of the electrical network that have been measured first are low-pass-filtered in such a way that only a fundamental wave remains. The purpose of the low-pass filtering is to remove the harmonic components. The filter type is not restricted in any way, and the phase errors caused by the filters do not affect the functioning of the method.

In practice, there is no need to filter out the harmonic waves of the voltage vector components $u_{2\alpha}$ and $u_{2\beta}$ quite completely, but it suffices to reduce their number to a predetermined level. Thus, in some cases low-pass filtering may not be needed at all.

In the procedure shown in FIG. 2, the axes of the ellipse are determined by recognizing the extreme value points of the length $|\underline{u}_2|$ of the fundamental wave voltage vector. The extreme value points are determined with a simple derivative test, which can be presented as a discreet algorithm below, where k is the time index and $T_S$ is the sampling period.

1. Compute the length $|\underline{u}_2|$ of the fundamental wave vector of the voltage.
2. Approximate the derivative with difference $d_k = (|\underline{u}_2|_k - |\underline{u}_2|_{k-1})/T_s$.
3. Check the extreme value conditions.
    If $d_k < 0$ and $d_{k-1} > 0$, a maximum (major semi-axis) is concerned.
    If $d_k > 0$ and $d_{k-1} < 0$, a minimum (minor semi-axis) is concerned.
4. If a maximum or minimum was found, store the current $u_{2\alpha,k}$ and $u_{2\beta,k}$, depending on the type of the extreme value, as components of vector $\underline{u}_{2,maj}$ or $\underline{u}_{2,min}$.

The classification of the extreme values on the basis of the zeros of the derivative signal, taking place at point 3 in the algorithm, is analogous with the classification of extreme values of continuous functions based on the sign of the second derivative. In the practical implementation at point 1, the quadratic length of the fundamental wave vector can be used, because the square root as a monotonic function does not affect the extreme values. Further, at point 2 the difference quotient can be replaced with the difference by omitting the division by the sampling period $T_S$.

When the above-described algorithm is used, the sampling period $T_S$ may be 100 μs, for example. At point 4 of the algorithm, the number of values $u_{2\alpha,f,k}$ and $u_{2\beta,f,k}$ to be stored can, if desired, be halved by storing only the semi-axis components that are located at the left half-plane, for example.

Determination of the components of the semi-axes of the ellipse is the only time-critical stage in measuring the negative sequence system. The other stages may be implemented at slower time planes, for instance at a time plane of 1 ms. The lengths $l_{maj}$ and $l_{min}$ of the semi-axes of the voltage ellipse are computed by means of determined components with the following equations:

$$l_{maj} = \sqrt{u_{2\alpha,maj}^2 + u_{2\beta,maj}^2} \text{ and}$$

$$l_{min} = \sqrt{u_{2\alpha,min}^2 + u_{2\beta,min}^2}.$$

The magnitudes $u_{2,PSS}$ and $u_{2,NSS}$ of the positive sequence and negative sequence components can be computed by means of the lengths $l_{maj}$ and $l_{min}$ of the semi-axes of the ellipse with the above-described equation. The following equation yields the angle $\alpha_{min}$ of the minor semi-axis of the ellipse:

$$\alpha_{min} = \arctan\left(\frac{u_{2\beta,min}}{u_{2\alpha,min}}\right).$$

Figure 3:
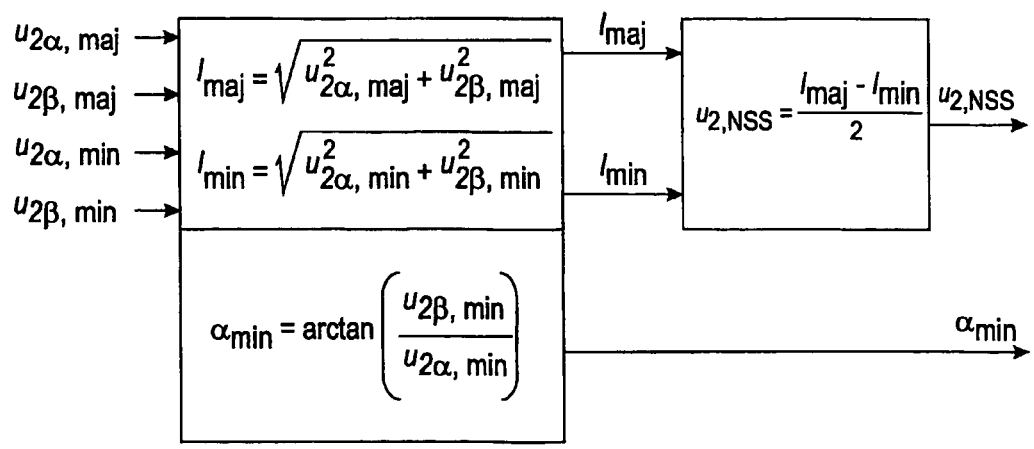
FIG. 3 shows a block diagram for determining the magnitude of the negative sequence component of the voltage in an electrical network and the angle of the minor semi-axis of the voltage ellipse.

One way to determine the length $u_{2,NSS}$ of the negative sequence vector of the voltage in the electrical network and the angle $\alpha_{min}$ of the minor semi-axis of the voltage ellipse is shown in FIG. 3. The output information of the block diagram of FIG. 2, i.e. the components of the major and minor semi-axes of the ellipse formed by the voltage space vector in the electrical network, is fed to the input of the block diagram of FIG. 3.

Above, the ellipse formed by a voltage space vector in an electrical network is assumed to be of a shape of a complete ellipse, known from the theory of mathematics. In practice, the ellipse formed by a voltage space vector in an electrical network is always somewhat deformed, but it is obvious that this does not in any way prevent the use of the method according to the invention, because with an appropriate algorithm, the location of the semi-axes can be determined even from an incomplete ellipse. There are several known algorithms applicable to the determination of the semi-axes of incomplete ellipses, and the method according to the invention does not impose restrictions on the algorithm to be used.

In the above example, the method according to the invention is used for determining properties of a negative sequence component of the voltage in an electrical network. It will be obvious to a person skilled in the art that the method according to the invention can also be used for determining properties of a negative sequence component of other space vector quantities, such as current.

Above, the method according to the invention is used in a case where there is no zero sequence component in the electrical network. Although the presented method is based on measuring a space vector of a space vector quantity where a zero sequence component is not seen in any way, it is clear that the method according to the invention can be used for determining also such space vector quantities in electrical networks where the zero sequence component occurs.

It will be obvious to a person skilled in the art that the basic idea of the invention can be implemented in a plurality of ways. Thus, the invention and its embodiments are not restricted to the above examples but may vary within the scope of the claims.

The invention claimed is:

1. A method for controlling an electrical network, the method comprising steps of:
    determining components of a space vector of a space vector quantity in an electrical network;
    determining the length of the space vector of the space vector quantity and its derivative;
    determining the zeros of said derivative;
    determining, based on said determined zeros of said derivative, the components of the major and minor semi-axes of the ellipse formed by the space vector of the space vector quantity;
    determining, based on said determined components of the major and minor semi-axes of the ellipse formed by the space vector, the magnitude of the negative sequence component of the space vector quantity and the location of the negative sequence component of the space vector quantity in relation to a positive sequence component, and
    controlling the electrical network by supplying in the electrical network a voltage whose voltage unbalance has been compensated based on said determined magnitude of the negative sequence component of the space vector quantity and said determined location of the negative sequence component of the space vector quantity in relation to a positive sequence component.

2. A method according to claim 1, wherein several values for the length of the space vector of the space vector quantity are determined, corresponding to several different moments of time, whereby the difference between two successive moments of time is equal to a sampling period;
    the step for determining the derivative of the space vector of the space vector quantity comprising approximation of the derivative of the space vector of the space vector quantity with a difference received by means of the length values of the space vector of the space vector quantity and the sampling period corresponding to successive moments of time;

the step for determining the components of the major and minor semi-axes formed by the space vector of the space vector quantity in the electrical network comprising steps where differences representing the derivative of the space vector of the space vector quantity, corresponding to successive moments of time, are compared with zero, whereby, when the later one of successive differences is smaller than zero and when the earlier difference is greater than zero, a maximum is concerned, and when the later one of successive differences is greater than zero and when the earlier difference is smaller than zero, a minimum is concerned;

whereby, when a maximum is found, the current components of the space vector of the space vector quantity in the electrical network are set as components of the major semi-axis vector of the ellipse, and when a minimum is found, the current components of the space vector of the space vector quantity in the electrical network are set as components of the minor semi-axis vector of the ellipse.

3. A method according to claim 1, wherein the length of each semi-axis of the ellipse formed by the space vector of the space vector quantity is determined by summing up the squared components of the semi-axis in question and by taking a square root of this sum;

the angle of the minor semi-axis of the ellipse formed by the space vector of the space vector quantity is determined trigonometrically on the basis of the components of the minor semi-axis of the ellipse in question; and the length of the negative sequence vector of the space vector quantity in the electrical network is determined by dividing the difference of the lengths of the major and minor semi-axes of the ellipse formed by the space vector of the space vector quantity by two.

4. A method according to claim 1, wherein the method further comprises a step where by means of low-pass-filtering components of the space vector of the space vector quantity in the electrical network, the components containing substantially only a fundamental wave are provided, whereby the angle of the minor semi-axis of the ellipse formed by the space vector of the space vector quantity and the magnitude of the negative sequence component of the space vector quantity in the electrical network are determined on the basis of the space vector of the space vector quantity formed by said components containing substantially only a fundamental wave.

5. A method according to claim 1, wherein said space vector quantity in the electrical network is voltage.

6. A method according to claim 1, wherein the step of determining the location of the negative sequence component of the space vector quantity in the electrical network in relation to a positive sequence component comprises determining the angle of the minor semi-axis of the ellipse formed by the space vector of the space vector quantity in the electrical network.

7. A method for compensating a voltage unbalance in an electrical network, the method comprising steps of:

determining components of a space vector of voltage in an electrical network;

determining the length of the space vector of the voltage and its derivative;

determining the zeros of said derivative;

determining, based on said determined zeros of said derivative, the components of the major and minor semi-axes of the ellipse formed by the space vector of the voltage;

determining, based on said determined components of the major and minor semi-axes of the ellipse formed by the space vector, the magnitude of the negative sequence component of the voltage and the location of the negative sequence component of the voltage in relation to a positive sequence component, and supplying in the electrical network a voltage whose voltage unbalance has been compensated based on said determined magnitude of the negative sequence component of the voltage and said determined location of the negative sequence component of the voltage in relation to a positive sequence component.

8. A method for controlling an electrical network, the method comprising steps of:

determining components of a space vector of a space vector quantity in an electrical network;

determining the length of the space vector of the space vector quantity and its derivative;

determining the zeros of said derivative;

determining, based on said determined zeros of said derivative, the components of the major and minor semi-axes of the ellipse formed by the space vector of the space vector quantity;

determining, based on said determined components of the major and minor semi-axes of the ellipse formed by the space vector, the magnitude of the negative sequence component of the space vector quantity and the location of the negative sequence component of the space vector quantity in relation to a positive sequence component;

storing data based on said determined magnitude of negative sequence component and said determined location of the negative sequence component of the space vector quantity in relation to a positive sequence component; and controlling the electrical network based on said stored data.

9. A method for monitoring an electrical network, the method comprising steps of:

determining components of a space vector of a space vector quantity in an electrical network;

determining the length of the space vector of the space vector quantity and its derivative;

determining the zeros of said derivative;

determining, based on said determined zeros of said derivative, the components of the major and minor semi-axes of the ellipse formed by the space vector of the space vector quantity;

determining, based on said determined components of the major and minor semi-axes of the ellipse formed by the space vector, the magnitude of the negative sequence component of the space vector quantity and the location of the negative sequence component of the space vector quantity in relation to a positive sequence component, and displaying a voltage unbalance of the electrical network to a user based on said determined magnitude of the negative sequence component of the space vector quantity and said determined location of the negative sequence component of the space vector quantity in relation to a positive sequence component.

* * * * *